United States Patent [19]

Sasaki

[11] 4,404,733

[45] Sep. 20, 1983

[54] METHOD OF PRODUCING SEMICONDUCTOR DEVICES

[75] Inventor: Nobuo Sasaki, Kawasaki, Japan

[73] Assignee: Fujitsu Limited, Kawasaki, Japan

[21] Appl. No.: 343,154

[22] Filed: Jan. 27, 1982

[30] Foreign Application Priority Data

Jan. 28, 1981 [JP] Japan .................................. 56-11447

[51] Int. Cl.³ .......................................... H01L 21/223
[52] U.S. Cl. .................................... 29/571; 29/576 B; 29/591; 148/187; 148/188; 148/189
[58] Field of Search ........................ 148/187, 188, 189; 29/571, 591, 576 B

[56] References Cited

U.S. PATENT DOCUMENTS

| 3,825,442 | 7/1974 | Moore | 148/187 X |
| 4,124,933 | 11/1978 | Nicholas | 29/591 X |
| 4,224,089 | 9/1980 | Nishimoto et al. | 148/187 |
| 4,265,685 | 5/1981 | Seki | 148/187 X |
| 4,266,985 | 5/1981 | Ito et al. | 148/187 X |
| 4,271,582 | 6/1981 | Shirai et al. | 29/571 |
| 4,273,805 | 6/1981 | Dawson et al. | 148/187 X |
| 4,348,802 | 9/1982 | Shirato | 148/188 X |
| 4,371,403 | 2/1983 | Ikubo et al. | 148/187 X |

OTHER PUBLICATIONS

Woo et al., RCA Technical Notes, No. 1234, Nov. 27, 1979, 2 pages.

Primary Examiner—G. Ozaki
Attorney, Agent, or Firm—Staas & Halsey

[57] ABSTRACT

An improved contact hole in a method of producing a semiconductor device by forming a silicon dioxide insulating layer by a chemical vapor deposition method on a semiconductor substrate, forming a contact hole in the insulating layer diffusing phosphorus or boron impurities into a portion of the insulating layer around the contact hole, heating the substrate to cause plastic flow of the insulating layer; and forming a conductive layer on the insulating layer, wherein the portion of the insulating layer containing a high concentration of phosphorus or boron plastically flows during the heating step.

8 Claims, 15 Drawing Figures

METHOD OF PRODUCING SEMICONDUCTOR DEVICES

BACKGROUND OF THE INVENTION

1. Field of the Invention

The present invention relates to a method of producing a semiconductor device, and more particularly to an improved method of forming an insulating layer having a gradually sloped contour, especially, a contact hole with a roundish edge.

2. Description of the Prior Art

A semiconductor device, for example a metal oxide semiconductor field effect transistor (MOS FET) type integrated circuit (IC), is frequently provided with a phosphosilicate glass (PSG) layer as an insulating film. The PSG layer exhibits a passivation effect, e.g. an effect of trapping cations (e.g. Na ions), and useful plastic flowability at a high temperature. For example, a method of producing a semiconductor device using the plastic flowability of the PSG is disclosed in U.S. Pat. No. 3,825,442.

Usually, a PSG layer containing a high concentration of phosphorus is formed on a semiconductor substrate, a contact hole (i.e. a through hole) for an electrode is formed in the PSG layer, and the semiconductor substrate is heated at a high temperature to soften the PSG layer and round off the edges of the contact hole. When a conductive layer (i.e. an electrode) is formed within the contact hole and on the PSG layer, the round edge of the contact hole prevents discontinuity in the conductive layer at the edge.

Figure 1:
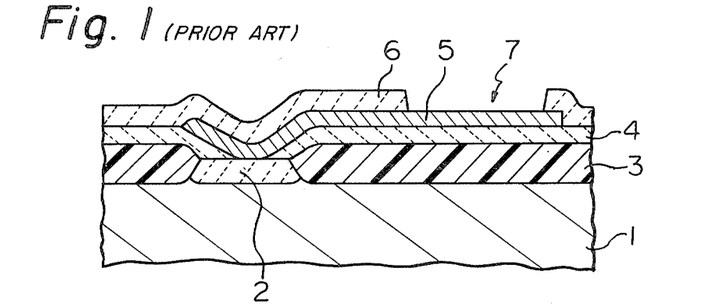
FIG. 1 is a partial cross-sectional view of a semiconductor device produced in accordance with prior art techniques.

FIG. 1 shows a part of a semiconductor device produced by using the plastic flow of the PSG layer. The device comprises a semiconductor (silicon) substrate 1 having an impurity doped region 2, a field oxide layer 3, a PSG layer 4 having a contact hole, a conductive (electrode) layer 5, and a covering 6 of PSG having an opening 7 for a bonding pad.

The semiconductor substrate 1 with the PSG layer 4 is heated to close to the softening point of the PSG, prior to the formation of the conductive layer 5, to cause plastic flow of the PSG layer at the edge of the contact hole, for connecting the conductive layer 5 to the impurity doped region 2, to round off the edge, as illustrated in FIG. 1. This makes it possible to prevent discontinuity of the conductive layer 5 at the edge of the contact hole.

It is preferable to carry out the heating treatment at as low a temperature as pssible in order to prevent deterioration of the semiconductor device caused by an elevated temperature (i.e., undesirable expansion of impurity doped regions formed in the semiconductor substrate; crystalline defects of the semiconductor substrate caused by thermal stress).

The higher the phosphorus concentration of the PSG, the lower the softening point of the PSG. For example, when the PSG has a high concentration of phosphorus of $1 \times 10^{21}$ atoms/cm$^3$, the heating treatment for plastic flow of the PSG is carried out at approximately 1000° C. Therefore, a PSG containing a high concentration of phosphorus is usually used.

However, the higher the concentration of phosphorus, the larger the moisture absorption (hygroscopicity) of the PSG. When the PSG layer takes up moisture, the moisture reacts with the phosphorus to generate an acid. Acids gradually corrode conductive layers, especially, aluminum lines, whereby the reliability and expected life of the semiconductor device are reduced.

Generally, a semiconductor device is provided with a covering layer 6 (FIG. 1) made of PSG containing a low concentration of phosphorus and having little moisture absorption. Furthermore, the semiconductor device is generally sealed in a package. Even so, there are still problems in reliability and expected life caused by the moisture absorption of the underlying layer 4 of PSG containing a high concentration of phosphorus. When a resin seal package is used, moisture inevitably penetrates from the air along the lead wires. The penetrated moisture reaches the underlying PSG layer 4 from around the exposed bonding pad portion of the conductive layer 5 after a long period, thereby causing corrosion of a portion of the conductive layer 5.

SUMMARY OF THE INVENTION

It is an object of the present invention to prevent the discontinuity of a conductive layer at an edge of a contact hole, by heating at a very low temperature a PSG layer to cause plastic flow so as to round off the edges, and to prevent the corrosion of the conductive layer caused by moisture absorption of the PSG layer.

It is another object of the present invention to provide an improved method of producing a semiconductor device without discontinuity and corrosion of the conductive layer.

The above mentioned objects can be attained by a method of producing a semiconductor device comprising the steps of: forming an insulating layer on a semiconductor substrate; forming a contact hole in the insulating layer; introducing impurities into a portion of said insulating layer around said contact hole; heating the insulating layer to cause plastic flow of the insulating layer at said portion so as to round the edge portions thereof defining the contact hole; and forming a conductive layer within the contact hole and on the insulating layer. According to one embodiment of the present invention, the insulating layer is made of silicon dioxide by a chemical vapor deposition method (CVD), impurities (e.g. phosphorus or boron) are selectively diffused or ion-implanted into a portion of the insulating layer around the contact hole, and the portion containing the impurities (i.e. PSG or borosilicate glass) plastically flows during the heating step.

The present invention will become more apparent from the description of the embodiments of the invention set forth below with reference to the accompanying drawings.

DETAILED DESCRIPTION OF THE PREFERRED EMBODIMENTS

Referring to FIGS. 2a through 2h, a method of producing a semiconductor device, for example, a metal oxide semiconductor (MOS) device, is now explained as the first embodiment of the present invention.

Figure 2A:
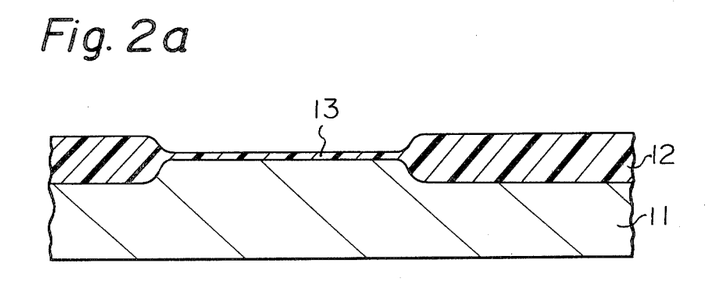
FIGS. 2a through 2b are partial cross-sectional views of a semiconductor device in stages of production in accordance with an embodiment of the present invention.

As illustrated in FIG. 2a, a semiconductor substrate 11 of a p-type silicon wafer is selectively oxidized to form a field oxide layer 12 of silicon dioxide by a conventional thermal oxidation method. Then a gate oxide layer 13 is formed on a portion of the semiconductor substrate 11 by a thermal oxidation method. For example, the field oxide layer 12 has a thickness of approximately 600 nm and the gate oxide layer 13 has a thickness of approximately 50 nm.

Figure 2B:
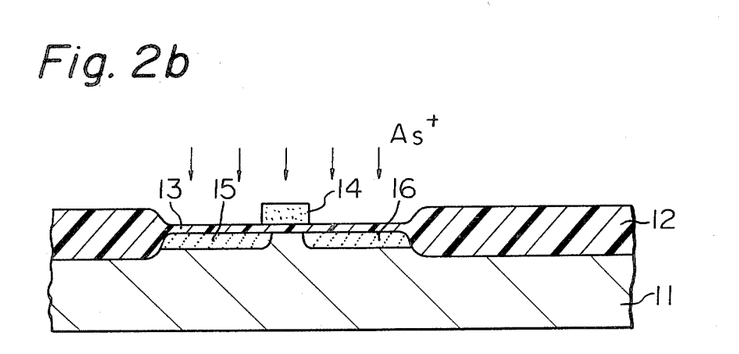

As illustrated in FIG. 2b, a polycrystalline silicon layer is formed on the oxide layers 12 and 13 by a conventional chemical vapor CVD method and is selectively etched by a conventional photoetching method to form a gate electrode 14. Then, conventional ion implantation of arsenic is carried out to form n-type source and drain regions 15 and 16 in the semiconductor substrate 11.

Figure 2C:
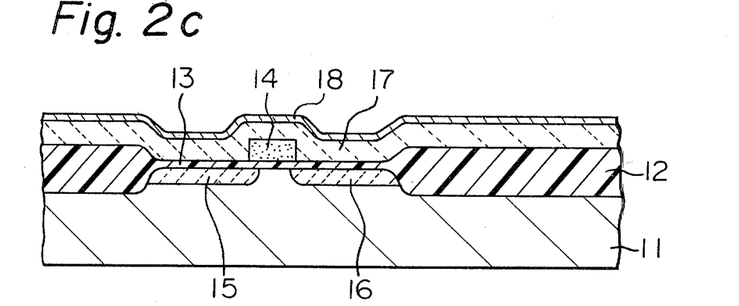

As illustrated in FIG. 2c, a silicon dioxide insulating layer 17 is formed on the oxide layers 12 and 13 and the gate electrode 14 by a CVD method. It is preferable to add a low concentration of phosphorus in the silicon dioxide layer 17 during the formation of the layer 17 for the passivation effect, namely, to form a PSG layer 17 containing a low concentration of phosphorus. In this case, the PSG layer has little moisture absorption capacity and has a softening point of 1100° C. or above. Then, a silicon nitride (Si$_3$N$_4$) layer 18 is formed on the insulating layer 17 by a CVD method. For example, the insulating layer 17 has a thickness of from 500 nm to 1 $\mu$m and the silicon nitride layer 18 has a thickness of from 100 to 200 nm.

Figure 2D:
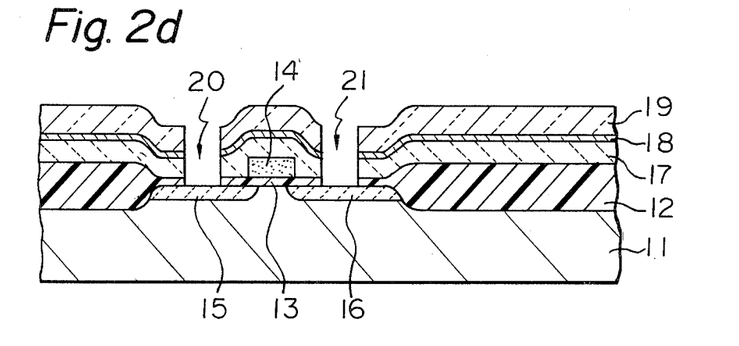

As illustrated in FIG. 2d, a photoresist layer 19 is applied on the silicon nitride layer 18, exposed through a photomask having a contact hole pattern and developed to form openings in the photoresist layer 19. The portions of the silicon nitride, insulating and gate oxide layers 18, 17, and 13, respectively, which are not covered with the photoresist layer 19 are etehed by a conventional plasma etching method to form contact holes (i.e. through holes) 20 and 21 (FIG. 2d).

Figure 2E:
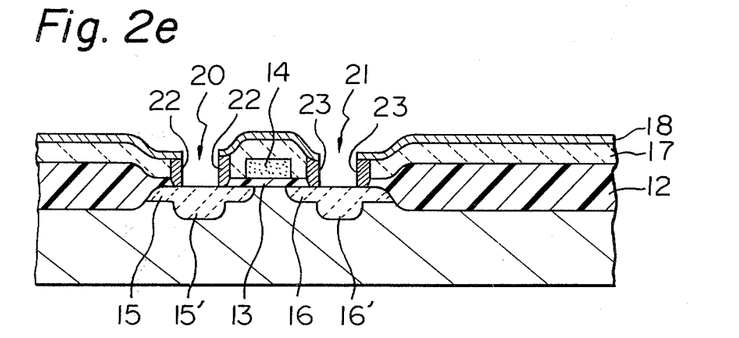

As illustrated in FIG. 2e, after the removal of the photoresist layer 19, a conventional thermal diffusion treatment of phosphorus using POCl$_3$ as a source of diffusion is carried out. In this case, the silicon nitride layer 18 serves as a mask against the phosphorus diffusion, so that phosphorus diffuses into the insulating layer 17 and gate oxide layer 13 through the contact holes 20 and 21 to form PSG portions 22 and 23 containing a high concentration of phosphorus. Simultaneously, phosphorus diffuses into the n-type source and drain regions 15 and 16 to form additional deep n-type regions 15' and 16'.

For example, when the phosphorus diffusion treatment is carried out at a temperature of approximately 1000° C. for a period of approximately 120 minutes, the PSG portions 22 and 23 surrounding the contact holes 20 and 21 have a phosphorus concentration of 1×10$^{21}$ atoms/cm$^3$ or more. The phosphorus diffusion rate in the silicon dioxide insulating layer 17 is higher than in the gate oxide layer 13 of silicon dioxide, since the insulating layer is formed by a CVD method and the gate oxide layer is formed by a thermal oxidation method.

The additional deep n-type regions 15' and 16' may be preferable when the depth of the source and drain regions 15 and 16 is very shallow, such as 300 nm, for a high density of elements. The shallow depth of the source and drain regions contributes to a short length of the gate and a small space for isolation. However, when an aluminum electrode is formed to come into contact with the source and drain regions through contact holes, an alloy layer of aluminum and silicon of the substrate may reach the junctions between substrate 11 and the source and drain regions 15 and 16 to generate a short-circuit. In a case where there are additional deep n-type regions 15' and 16' having a depth of approximately 800 nm, as illustrated in FIG. 2e, it is possible to prevent junction short-circuit trouble caused by the alloying of the electrode. Since the additional deep n-type regions 15' and 16' are formed within the source and drain regions 15 and 16, respectively, the formation of the additional regions 15' and 16' does not decrease the density of elements. Furthermore, the additional region of diffused phosphorus in the shallow n-type region of doped arsenic (i.e. the source and drain regions 15 and 16) can reduce the contact resistance advantageously.

Figure 2F:
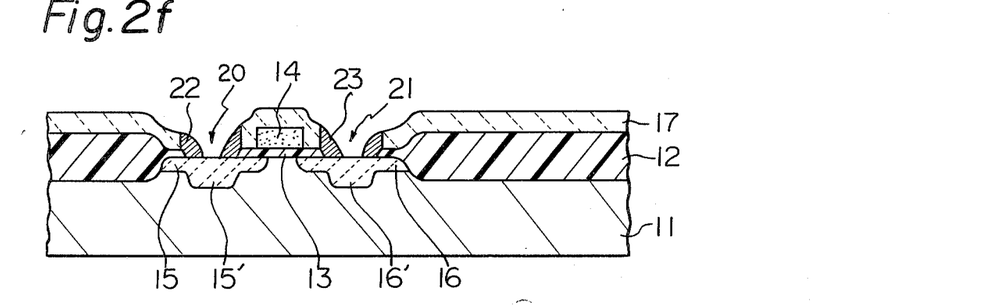

As illustrated in FIG. 2f, after the silicon nitride layer 18 is removed by etching, the obtained semiconductor substrate 11 is heated at a temperature of from 1000° C. to 1050° C. for a period of from 10 to 30 minutes to cause plastic flow of the PSG portions 22 and 23. This rounds off the edge of the PSG portions 22 and 23 defining the contact holes.

Figure 2G:
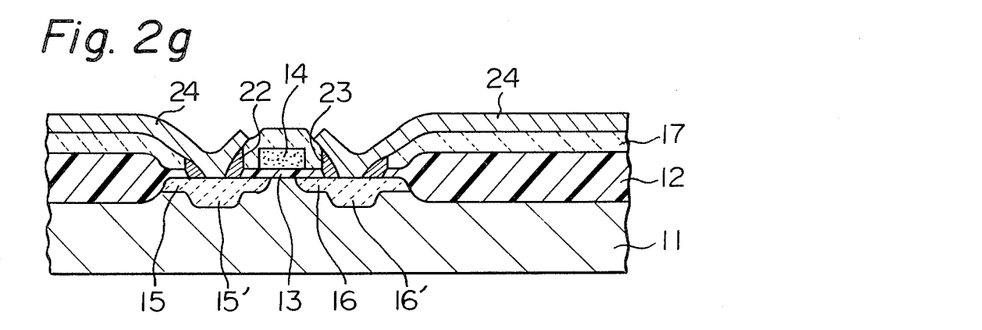

As illustrated in FIG. 2g, an aluminum layer 24 is formed by a conventional vacuum deposition method on the insulating layer 17. More particularly, the round PSG portions 22 and 23 and portions of the n-type regions 15 and 16 exposed within the contact holes, are selectively etched by a photoetching method to form the patterned conductive layer 24 of aluminum. As is obvious from FIG. 2g, there are no sharp edges on the PSG portions 22 and 23 at the contact hole, so that the conductive layer 24 does not have any discontinuity.

Figure 2H:
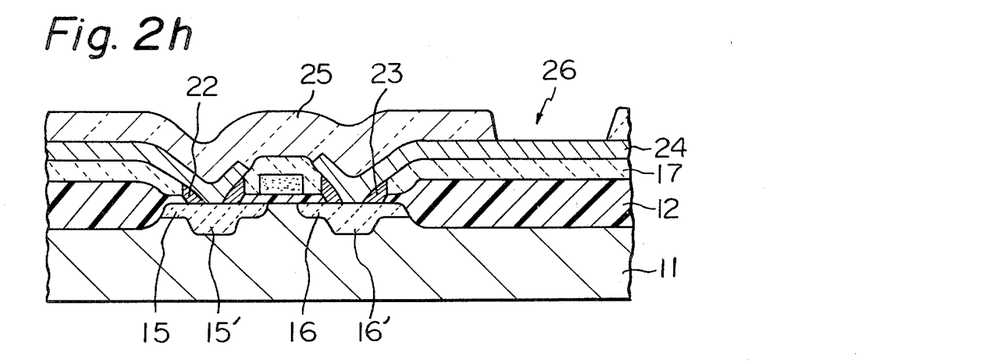

As illustrated in FIG. 2h, next a covering layer 25 of PSG containing a low concentration of phosphorus is formed on the conductive layer 24 and the insulating layer 17 by a CVD method and is selectively etched by a photoetching method to form an opening 26. The portion of the conductive layer 24 exposed within the opening 26 serves as a bonding pad. The obtained semiconductor device chip is wire-bonded and packed in a resin sealed package (not shown).

As is obvious from FIG. 2h, the PSG portions 22 and 23 containing a high concentration of phosphorus are locally formed away from the opening 26, which is a channel for moisture penetration, so that the possibility of trouble caused by moisture absorption of PSG is extremely low. Therefore, the reliabilty and expected life of the semiconductor device are increased.

A second embodiment of the present invention is carried out as follows.

Figure 3A:
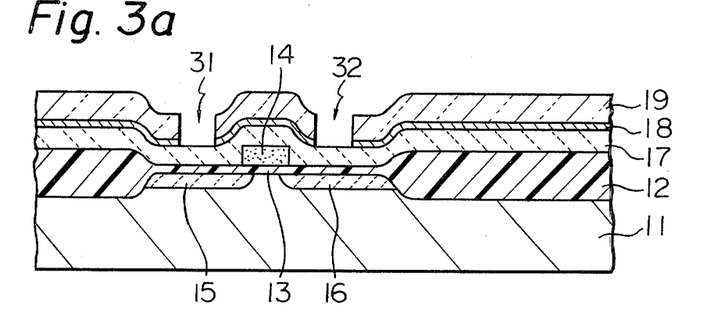
FIGS. 3a through 3c are partial cross-sectional views of a semiconductor device in stages of production in accordance with another embodiment of the present invention.

As illustrated in FIG. 3a, after the formation of the silicon nitride layer 18 (FIG. 2c) in the above-mentioned production process of the first embodiment, the photoresist layer 19 having openings 31 and 32 is formed on the silicon nitride layer 18. Then only the silicon nitride layer 18 is selectively etched by using a suitable etchant through the openings 31 and 32.

Figure 3B:
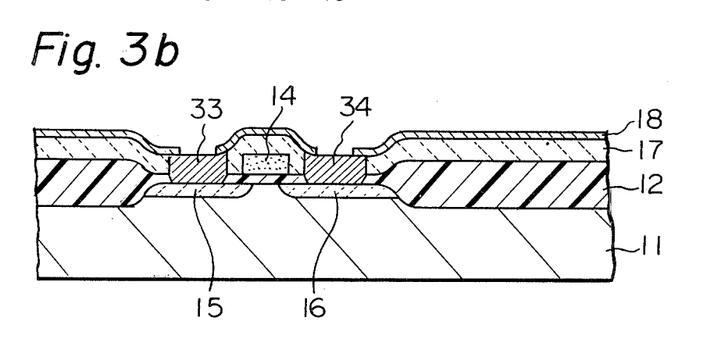

As illustrated in FIG. 3b, the photoresist layer 19 is then removed. Phosphorus is diffused into the insulating layer 17 of silicon nitride by a thermal diffusion treatment using the silicon nitride layer 18 as a mask, whereby PSG portions 33 and 34 containing a high concentration of phosphorus are formed. The phosphorus can diffuse not only in the vertical direction but also in the horizontal direction within the insulating layer 17, so that the PSG portions extend under the silicon nitride layer 18.

Figure 3C:
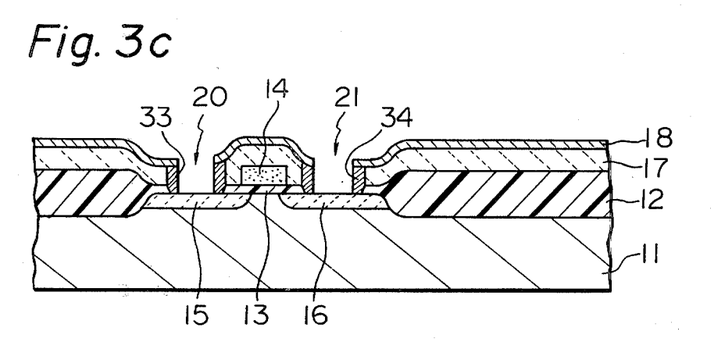

As illustrated in FIG. 3c, the portions of the PSG portions 33 and 34 which are not covered with the silicon nitride layer 18 are etched by a plasma etching method to form contact holes 20 and 21. The PSG portions with high concentration of phosphorus 33 and 34 are present around the contact holes 20 and 21. The structure obtained, shown in FIG. 3c, is similar to that shown in FIG. 2e. Then the heating treatment for plastic flow of the PSG portions 33 and 34 and the formation of a conductive layer are carried out in the same manner as that described in the first embodiment.

A third embodiment of the present invention is carried out as follows.

Figure 4A:
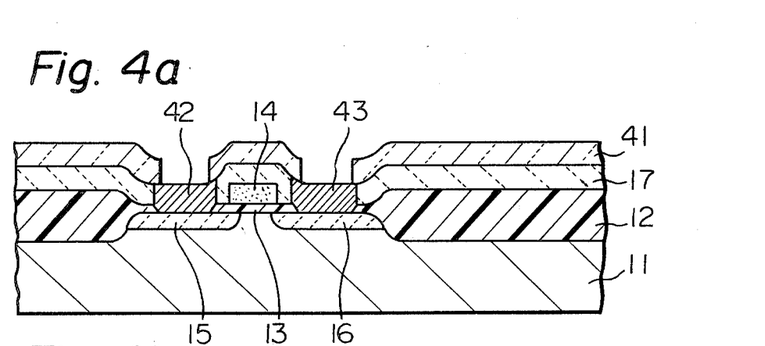
FIGS. 4a and 4b are partial cross-sectional views of a semiconductor device in stages of production in accordance with another embodiment of the present invention.

As illustrated in FIG. 4a, after the formation of the insulating layer 17 (see FIG. 2c) of silicon dioxide in the above-mentioned process of the first embodiment, a first photoresist layer 41 is applied on the insulating layer 17. The photoresist layer 41 is exposed and developed to form openings above the source and drain regions 15 and 16. Phosphorus impurities are introduced into the insulating layer 17 through the openings by a conventional ion implantation method to form PSG portions 42 and 43 containing a high concentration of phosphorus. For example, a phosphorus ion beam having an energy of 180 keV and a dose of $1 \times 10^{16}$ ions/cm$^2$ is used, and the resultant phosphorus concentration of the PSG portions is $1 \times 10^{21}$ atoms/cm$^3$ and more.

Figure 4B:
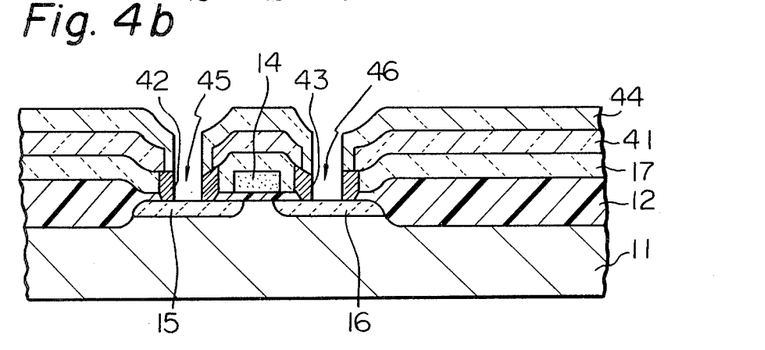

As illustrated in FIG. 4b, the second photoresist layer 44 is applied on the first photoresist layer 41 and the PSG portions 42 and 43, exposed, and developed to form small openings within the openings of the photoresist layer 41. Then the exposed portions of the PSG portions 42 and 43 are etched by a plasma etching method to form contact holes 45 and 46. The PSG portions with high concentration of phosphorus 42 and 43 are present around the contact holes 45 and 46. The first and second photoresists 41 and 44, respectively, are removed by a suitable remover.

The semiconductor substrate 11 obtained is heated at a temperature of from 1000° C. to 1050° C. to cause plastic flow of the PSG portions 42 and 43. As a result of the heating treatment, the whole surface profile of the obtained PSG portions 42 and 43 and the insulating layer 17 is almost the same as that illustrated in FIG. 2f. Then, a conductive layer (e.g., aluminum layer) and a covering layer (e.g., a PSG layer containing a low concentration of phosphorus) are successively formed in the same manner as that described in the first embodiment to complete the semiconductor device.

A fourth embodiment of the present invention is carried out as follows.

Figure 5:
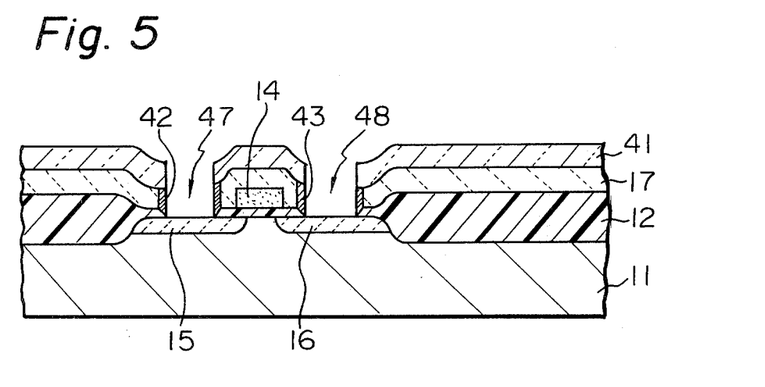
FIG. 5 is a partial cross-sectional view of a semiconductor device in a stage of production in accordance with still another embodiment of the present invention.

As illustrated in FIG. 5, after the phosphorus ion implantation described in the third embodiment, the formed PSG portions 42 and 43 (FIG. 4a) are etched by a plasma etching method using the photoresist layer 41 as a mask to form contact holes 47 and 48. In this case, the width of the PSG portions 42 and 43 present around the contact holes 47 and 48 is small, since a little of the phosphorus impurities are doped by the ion implantation in the horizontal direction under the photoresist layer 41. Accordingly, after the heating to produce plastic flow of the PSG portions, the slope of the contact holes 47 and 48 is steeper than that of the contact holes 45, 46 in the case of the third embodiment and of the contact holes 20, 21 (FIG. 2f) in the case of the first embodiment. Of course, the edges of the contact holes 47 and 48 (FIG. 5) are rounded off, so that the discontinuity of the conductive layer is prevented. For the photoresist layer 41, the negative photoresist is preferable to the positive photoresist, in that it has a better adhesion to silicon dioxide.

According to the present invention, since only a small PSG portion containing a high concentration of phosphorus is present around the contact hole, it is possible to cause plastic flow of the PSG portion at a relatively low temperature, the same as the temperature in a heating treatment of a conventional case, and to eliminate the trouble of electrode corrosion caused by the moisture absorption of the PSG. It will be obvious that the present invention is not restricted to the above-mentioned embodiments, and that many variations are possible for those skilled in the art without departing from the scope of the present invention. For example, when a borosilicate glass portion is formed instead of the PSG portion, an impurity doped region lying under the borosilicate glass portion in the semiconductor substrate should have p-type conductivity.

I claim:

1. A method of producing a semiconductor device, comprising the steps of: forming an insulating layer of silicon dioxide on a semiconductor substrate; forming a contact hole in said insulating layer; selectively introducing impurities into a portion of said insulating layer around said contact hole; heating the insulating layer to cause plastic flow of said insulating layer so as to round the edge portion thereof defining said contact hole; and forming a conducting layer within said contact hole and on said insulating layer.

2. A method according to claim 1, further comprising the steps of: forming a silicon nitride layer on said insulating layer after the formation of said silicon dioxide insulating layer, selectively etching said silicon nitride layer and insulating layer by a photoetching method to form said contact hole, diffusing said impurities into said portion of said insulating layer through said contact hole by a thermal diffusion method, and removing said silicon nitride layer prior to said heating step.

3. A method according to claim 1, further comprising the steps of: forming a silicon nitride layer on said insulating layer after the formation of said silicon dioxide insulating layer, selectively etching said silicon nitride layer to form an opening by a photoetching method, diffusing said impurities into said insulating layer through the opening by a thermal diffusion method, etching a portion of said insulating layer through the opening by a plasma etching method to form said contact hole, and removing said silicon nitride layer prior to said heating step.

4. A method according to claim 1, further comprising the steps of: forming a first patterned photoresist layer on said insulating layer after the formation of said silicon dioxide insulating layer, selectively introducing said impurities into said insulating layer by an ion implantation method using the first photoresist layer as a mask, forming a second patterned photoresist layer on the first photoresist layer, etching a portion of said insulating layer containing said impurities by a plasma etching method using the second photoresist layer as a mask to form said contact hole, and removing the first and second photoresist layers prior to said heating step.

5. A method according to claim 1, further comprising the steps of: forming a patterned photoresist layer on said insulating layer after the formation of said silicon dioxide insulating layer, selectively introducing said impurities into said insulating layer by an ion implantation method using the photoresist layer as a mask, etching a portion of said insulating layer containing said impurities by a plasma etching method using the photoresist layer as a mask to form said contact hole, and removing the photoresist layer prior to said heating step.

6. A method according to claims 1, 2, 3, 4 or 5, wherein said impurities are phosphorus or boron.

7. A method according to claims 1, 2, 3, 4 or 5, wherein during the formation of said silicon dioxide insulating layer, the concentration of phosphorus contained in said insulating layer is lower than the concentration of the impurities adjacent the contact hole.

8. The method according to claims 1, 2, 3, 4 or 5, wherein the heating step occurs approximately in the temperature range of from 1000° C. to 1050° C.

* * * * *

UNITED STATES PATENT AND TRADEMARK OFFICE
CERTIFICATE OF CORRECTION

PATENT NO. : 4,404,733

DATED : September 20, 1983

INVENTOR(S) : Nobuo Sasaki

It is certified that error appears in the above-identified patent and that said Letters Patent is hereby corrected as shown below:

Col. 2, line 57, "2b" should be --2h--.

Signed and Sealed this

Twenty-seventh Day of December 1983

[SEAL]

Attest:

GERALD J. MOSSINGHOFF

Attesting Officer — Commissioner of Patents and Trademarks